(12) United States Patent
Kavalieros et al.

(10) Patent No.: US 7,456,068 B2
(45) Date of Patent: Nov. 25, 2008

(54) FORMING ULTRA-SHALLOW JUNCTIONS

(75) Inventors: Jack T. Kavalieros, Portland, OR (US);
Mark Y. Liu, Portland, OR (US);
Suman Datta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 11/449,972

(22) Filed: Jun. 8, 2006

(65) Prior Publication Data

US 2007/0287259 A1    Dec. 13, 2007

(51) Int. Cl.
*H01L 21/336* (2006.01)
*H01L 21/4763* (2006.01)

(52) U.S. Cl. .................. 438/301; 438/303; 438/530; 438/585; 257/E21.634

(58) Field of Classification Search .............. 438/301, 438/302, 303, 304, 285; 257/E21.634, E21.431, 257/E21.43, E21.337, E21.342, E21.347
See application file for complete search history.

(56) References Cited

U.S. PATENT DOCUMENTS

| | | | |
|---|---|---|---|
| 6,265,253 B1 * | 7/2001 | Lukanc et al. ............... | 438/199 |
| 6,461,924 B2 * | 10/2002 | Kim et al. ................... | 438/305 |
| 6,559,015 B1 * | 5/2003 | Yu .............................. | 438/301 |
| 6,667,199 B2 * | 12/2003 | Torii et al. .................. | 438/183 |
| 6,675,057 B2 | 1/2004 | Liu | |
| 6,812,106 B1 * | 11/2004 | Xiang et al. ................ | 438/301 |
| 6,858,483 B2 | 2/2005 | Doczy et al. | |
| 6,872,627 B2 * | 3/2005 | Chen et al. .................. | 438/303 |
| 6,952,269 B2 | 10/2005 | Maiz et al. | |
| 6,953,719 B2 | 10/2005 | Doczy et al. | |
| 6,972,225 B2 | 12/2005 | Doczy et al. | |
| 7,015,126 B2 * | 3/2006 | Wu et al. ..................... | 438/592 |
| 2005/0064664 A1 * | 3/2005 | Shima ......................... | 438/275 |
| 2006/0134872 A1 * | 6/2006 | Hattendorf et al. .......... | 438/300 |

* cited by examiner

*Primary Examiner*—Scott B. Geyer
*Assistant Examiner*—Mohsen Ahmadi
(74) *Attorney, Agent, or Firm*—Blakely, Sokoloff, Taylor & Zafman LLP

(57) ABSTRACT

A method to form an ultra-shallow junction is described. In one embodiment, a replacement gate process is utilized to enable the overlap of a gate electrode over the regions of a semiconductor substrate where tip extensions reside. In another embodiment, a sacrificial spacer is utilized in conjunction with the replacement gate process. In one embodiment, an initial gate electrode is formed with a gate length smaller than the desired final gate length and is subsequently replaced with an expanded gate electrode having the desired gate length.

15 Claims, 12 Drawing Sheets

FORMING ULTRA-SHALLOW JUNCTIONS

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of shallow junctions into the active portions of a semiconductor substrate, e.g. the use of shallow tip extensions. The presence of such shallow junctions may greatly enhance the rate at which charge migrates in a channel when a semiconductor is in an ON state.

In the drive for ever-shallower junction depths, laser annealing of a dopant-implanted region of a semiconductor substrate may be utilized. Under appropriate annealing conditions, a laser anneal process may activate dopants, i.e. cause them to be substitutionally incorporated into the lattice of a substrate material, with negligible diffusion of the dopants into other regions of the substrate. This effect may be desirable because the depth of a junction may be kept confined to the implant depth of the dopant impurities, providing an ultra-shallow junction. However, the lateral diffusion of the dopants may also be restricted by the above annealing process. This may be undesirable in the case where overlap of a gate electrode over tip extensions is insufficient for optimal performance of, e.g. a MOS-FET. Thus, a method to fabricate ultra-shallow junctions is described herein.

DETAILED DESCRIPTION

Figure 1A:
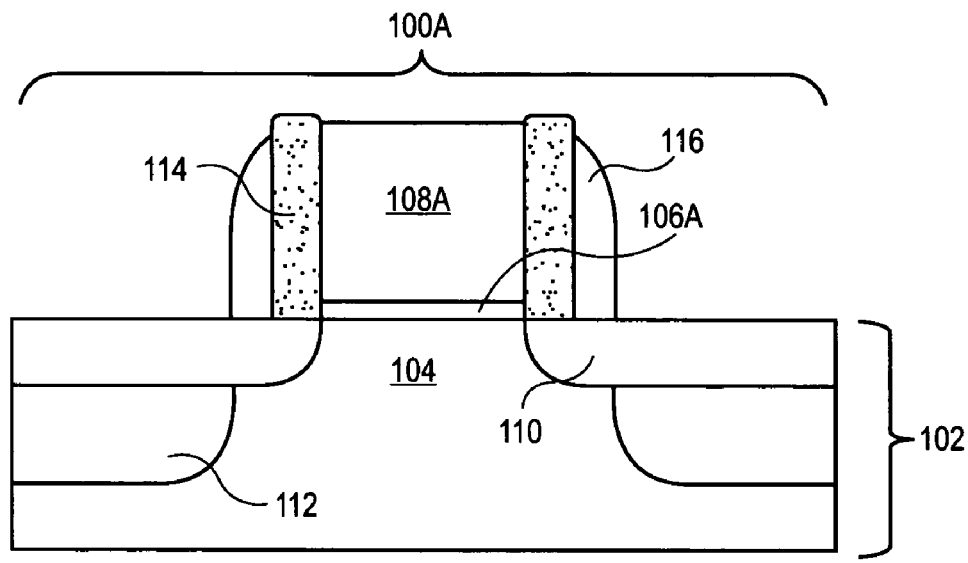
FIGS. 1A-B illustrate cross-sectional views representing the formation of a planar MOS-FET with ultra-shallow junctions, in accordance with an embodiment of the present invention.

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a method to form ultra-shallow junctions for semiconductor devices. Laser annealing of dopant impurity atoms implanted into a substrate may activate the dopant impurity atoms, i.e. cause them to be substitutionally integrated into the lattice of the substrate, while minimizing the extent of diffusion of the dopant impurity atoms during the annealing process. By minimizing the diffusion of the dopant impurity atoms, a highly doped ultra-shallow junction may be achieved. The ultra-shallow junction may enable the formation of high performance semiconductor devices, such as high speed MOS-FETs for use in logic and memory applications. In order to accommodate for a low-diffusion annealing process, an expansion replacement gate process may be employed to cause a gate electrode to overlap the ultra-shallow junctions. Thus, optimization of a high performance semiconductor device may be achieved.

Charge-carrier dopant impurity atoms may be incorporated into a crystalline substrate or an epitaxial film, e.g. carbon, silicon, germanium, oxygen, sulfur, selenium or tellurium in a III-V substrate/epitaxial film or phosphorus, boron, indium or arsenic in a silicon substrate/epitaxial film. An implant process may be used to deliver a high concentration of dopant impurity atoms into the crystalline lattice of a semiconductor substrate or epitaxial film to form shallow interstitial implant regions within the crystalline lattice. Activation of the implanted dopant impurity atoms to cause substitutional doping in the lattice of the semiconductor may be achieved by a variety of annealing methods. Laser annealing may be used to activate dopant impurity atoms to form ultra-shallow junctions, such as ultra-shallow tip extensions for high performance MOS-FETs. Since laser annealing may mitigate diffusion of the dopant impurity atoms deeper into the semiconductor substrate, an ultra-shallow profile may be maintained. Thus, high concentration, yet very shallow, tip extensions may be formed.

In order to optimize the performance of a semiconductor device that incorporates ultra-shallow junctions, such as ultra-shallow tip extensions, it may be desirable to expand the gate length of a gate electrode used in conjunction with the ultra-shallow junctions. For example, in accordance with an embodiment of the present invention, tip extensions are formed by implanting dopant impurity atoms in a process that is self-aligned to a gate electrode placeholder. Thus, implant regions may be formed in the substrate, on either side of a gate electrode, and subsequently laser annealed to form ultra-shallow tip extensions. The diffusion of the dopant impurity atoms may be mitigated to the extent that the gate electrode negligibly overlaps the portions of the semiconductor substrate containing the tip extensions. For optimal performance of the semiconductor device that comprises such ultra-shallow tip extensions and a gate electrode, it may be desirable to expand the gate electrode, either before or after the annealing process, in order to cause the gate electrode to overlap the tip extensions. In accordance with an embodiment of the present invention, a replacement gate process is utilized to enable the overlap of a gate electrode over the regions of a semiconductor substrate where tip extensions reside. A sacrificial spacer may be utilized in conjunction with the replacement gate process. Thus, by forming an initial gate electrode with a gate length smaller than the desired final gate length and subsequently replacing the initial gate electrode with an expanded gate electrode having the desired gate length, optimization of semiconductor devices that incorporate ultra-shallow junctions may be achieved.

Figure 1B:
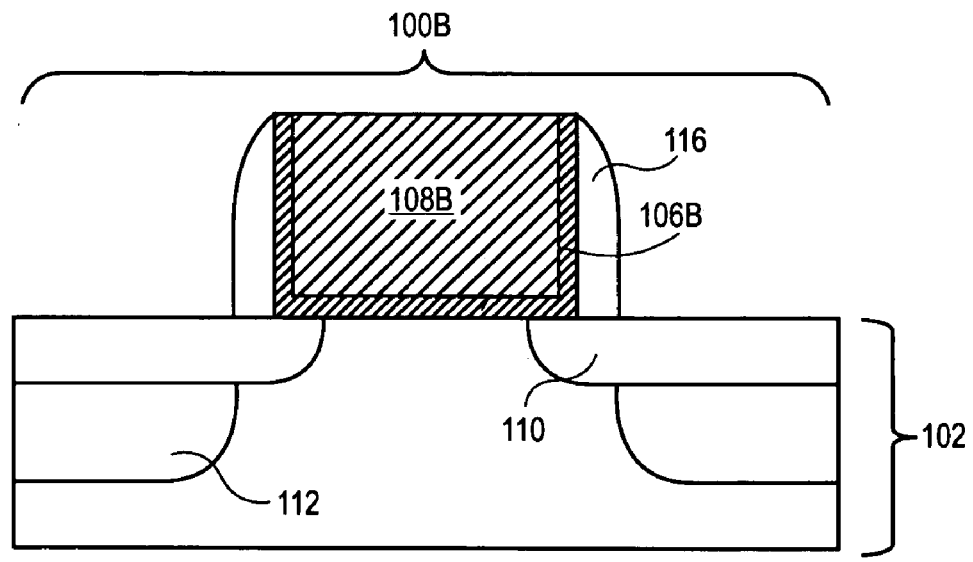

A replacement gate technique may be used to optimize the incorporation of ultra-shallow junctions into a high performance semiconductor device. FIGS. 1A-B illustrate cross-sectional views representing the formation of a planar MOS-FET with ultra-shallow junctions, in accordance with an embodiment of the present invention. MOS-FET 100A may be comprised of substrate or epitaxial layer 102 which includes a channel region 104, a gate dielectric layer 106A, a gate electrode placeholder 108A, ultra-shallow tip extensions 110, source/drain regions 112, an inner set of gate isolation spacers 114 and an outer set of gate isolation spacers 116. In accordance with an embodiment of the present invention, gate electrode placeholder 108A overlaps negligibly over ultra-shallow tip extensions 110, as depicted in FIG. 1A.

Referring to FIG. 1B, inner set of gate isolation spacers 114 may be removed. Additionally, gate dielectric layer 106A and gate electrode placeholder 108A may be replaced with gate dielectric layer 106B and gate electrode 108B, respectively. In accordance with an embodiment of the present invention, gate electrode 108B overlaps the region of substrate or epitaxial layer 102 that comprises ultra-shallow tip extensions 110. Thus, the dimensions of a gate electrode placeholder 108A with a smaller than desirable gate length, coupled with a removable inner set of gate isolation spacers 114, may be targeted for fabrication of gate electrode 108B with an expanded, and desired, gate length, which overlaps ultra-shallow tip extensions 110.

Ultra-shallow junctions with overlapping features, such as ultra-shallow tip extensions with an overlapping gate electrode, may be formed for any semiconductor device. In one embodiment, the semiconductor device is a planar MOS-FET, a bipolar transistor, a memory transistor or a micro-electronic machine (MEM). In another embodiment, the semiconductor device is a non-planar device, such as a tri-gate or double-gate transistor, an independently-accessed double gated MOS-FET, or a gate-all-around MOS-FET with a nanowire channel. FIGS. 2A-I illustrate cross-sectional views representing the formation of a planar MOS-FET with ultra-shallow junctions, in accordance with an embodiment of the present invention. As will be appreciated in the typical integrated circuit, both N- and P-channel transistors may be fabricated in a single substrate or epitaxial layer to form a CMOS integrated circuit.

Figure 2A:
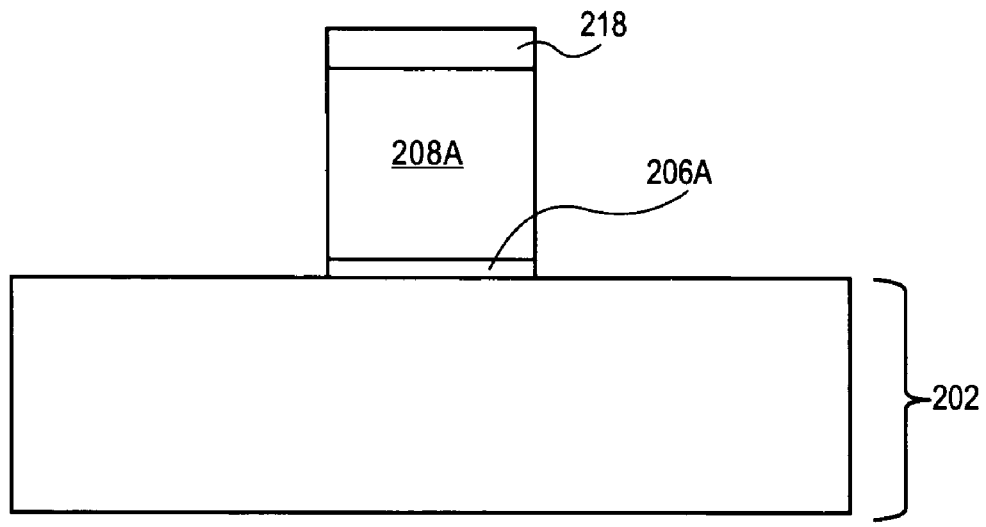
FIGS. 2A-K illustrate cross-sectional views representing the formation of a planar MOS-FET with ultra-shallow junctions, in accordance with an embodiment of the present invention.

As an example of one embodiment of the present invention, FIGS. 2A-K illustrate the formation of ultra-shallow tip extensions optimized with a replacement gate process scheme. Referring to FIG. 2A, a gate electrode placeholder 208A is formed above a gate dielectric layer 206A, which is formed above substrate or epitaxial layer 202. Substrate or epitaxial layer 202 may be non-insulating and may comprise a semiconducting material. In one embodiment, substrate or epitaxial layer 202 is formed by doping a crystalline silicon, germanium or silicon/germanium layer with an appropriate charge carrier, such as but not limited to phosphorus, arsenic, boron, indium or a combination thereof. In another embodiment, substrate or epitaxial layer 202 is comprised of a III-V material such as but not limited to gallium nitride, gallium phosphide, gallium arsenide, indium phosphide or indium antimonide.

Gate dielectric layer 206A may be formed with any material suitable to insulate gate electrode 208A from substrate or epitaxial layer 202. In accordance with one embodiment of the present invention, gate dielectric layer 206A is formed with a material suitable for removal without impacting substrate or epitaxial layer 202. In one embodiment, gate dielectric layer 206A is formed by a thermal oxidation process or a PE-CVD process and is comprised of silicon dioxide or silicon oxy-nitride. In another embodiment, gate dielectric layer 206A is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide. In one embodiment, gate dielectric 206A is the final gate dielectric layer, i.e. it is not subsequently replaced.

Gate electrode placeholder 208A may be formed with any material suitable for patterning at dimensions smaller than the desired gate length of the final semiconductor device. In accordance with an embodiment of the present invention, gate electrode placeholder 208A is formed with a material suitable for removal at the replacement gate step, as discussed below. In one embodiment, gate electrode placeholder 208A is comprised of polycrystalline silicon, amorphous silicon, silicon dioxide, silicon nitride, a metal layer or a combination thereof. In another embodiment, a protective capping layer 218, such as a silicon dioxide or silicon nitride layer, is formed above gate electrode placeholder 208A.

Figure 2B:
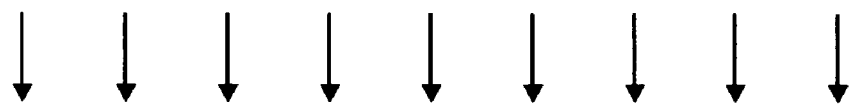
Figure 2B:
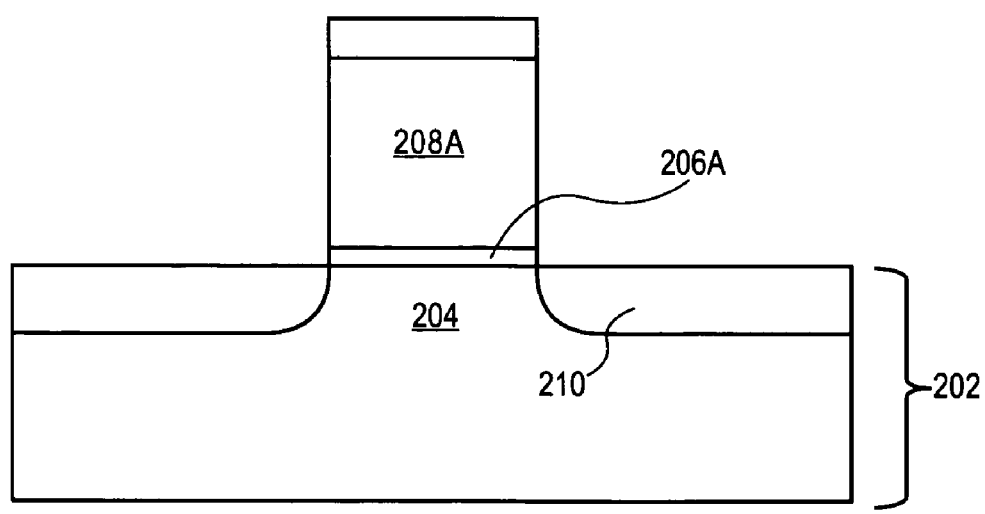
Figure 2C:
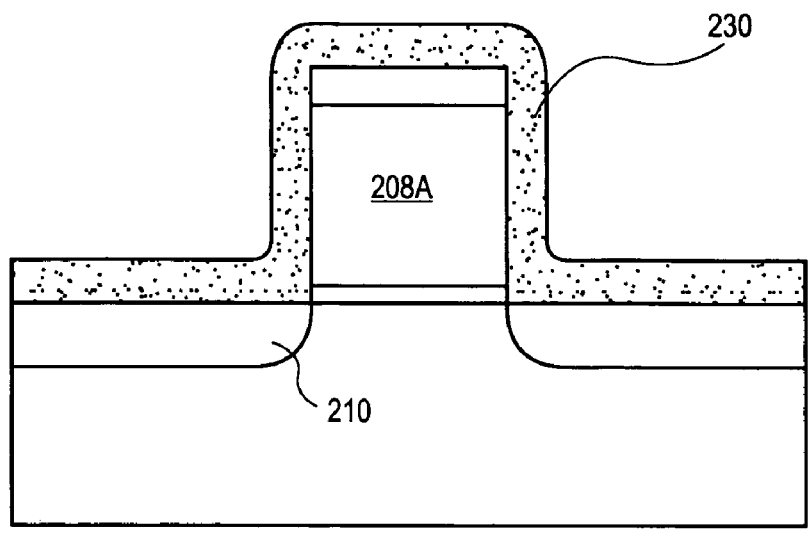

Ultra-shallow tip extensions 210 may be formed by implanting charge carrier dopant impurity atoms into substrate or epitaxial layer 202, as depicted in FIG. 2B. In accordance with an embodiment of the present invention, gate electrode placeholder 208A acts to mask a portion of substrate or epitaxial layer 202, forming self-aligned ultra-shallow tip extensions 210. By self-aligning ultra-shallow tip extensions 210 with gate electrode placeholder 208A, channel region 204 may be formed in the region of substrate or epitaxial layer 202 that is underneath gate electrode placeholder 208A and gate dielectric layer 206A, as depicted in FIG. 2B. In one embodiment, boron, arsenic, phosphorus, indium or a combination thereof is implanted into substrate or epitaxial layer 202 to form ultra-shallow tip extensions 210. In another embodiment, the charge carrier dopant impurity atoms implanted to form ultra-shallow tip extensions 210 are of opposite conductivity to channel region 204.

In order to activate the charge carrier dopant impurity atoms implanted into substrate or epitaxial layer 202 to form ultra-shallow tip extensions 210, any suitable annealing technique may be used. In accordance with an embodiment of the present invention, a laser annealing technique is employed to cause the charge carrier dopant impurity atoms of ultra-shallow tip extensions 210 to become substitutionally incorporated into the atomic lattice of substrate or epitaxial layer 202. Conditions of the laser anneal process may be selected such that diffusion of the charge carrier dopant impurity atoms from ultra-shallow tip extensions 210 into other regions of substrate or epitaxial layer 202 is negligible. In one embodiment, ultra-shallow tip extensions 210 are annealed with an eximer laser for a duration of 10 nanoseconds-1000 nanoseconds. In another embodiment, ultra-shallow tip extensions 210 are formed by implanting phosphorus dopant atoms with an energy in the range of 2 keV-10 keV at a dose in the range of 5E14 atoms/cm$^2$-5E15 atoms/cm$^2$ to form a post-annealing phosphorus dopant concentration in the range of 1E20 atoms/cm$^3$-1E21 atoms/cm$^3$, or by implanting arsenic dopant atoms with an energy in the range of 1 keV-5 keV at a dose in the range of 5E14 atoms/cm$^2$-5E15 atoms/cm$^2$ to form a post-annealing arsenic dopant concentration in the range of 1E20 atoms/cm$^3$-1E21 atoms/cm$^3$, or by implanting boron dopant atoms with an energy in the range of 0.2 keV-1 keV at a dose in the range of 5e14 atoms/cm$^2$-5E15 atoms/cm$^2$ to form a post-annealing boron dopant concentration in the range of 1E20 atoms/cm$^3$-1E21 atoms/cm$^3$. In one embodiment, subsequent to the laser annealing step, ultra-shallow tip extensions 210 have a depth in substrate or epitaxial layer 202 in the range of 5 nanometers-30 nanometers.

A pair of inner gate isolation spacers may then be formed by any suitable technique. In one embodiment, referring to FIG. 2C, a material layer 230 is deposited by a chemical vapor deposition process and is conformal with the structure formed in FIG. 2B. In an embodiment, material layer 230 is comprised of an insulating layer. In a particular embodiment, material layer 230 is comprised of silicon dioxide, silicon oxy-nitride, carbon-doped silicon oxide or a combination thereof. In another embodiment, material layer 230 is comprised of silicon nitride or carbon-doped silicon nitride.

Material layer 230 may be deposited to a thickness selected to determine the final width of the inner gate isolation spacers. Since the inner gate isolation spacers may subsequently be removed during the replacement gate process, material layer 230 may be deposited to a thickness that determines the expansion width of the replacement gate electrode, i.e. to determine the amount that the replacement gate electrode will overlap ultra-shallow tip extensions 210. In accordance with an embodiment of the present invention, material layer 230 is deposited to a thickness of half the desired gate electrode expansion width. In one embodiment, material layer 230 is deposited to a thickness in the range of 50-200 Angstroms. In another embodiment, material layer 230 is deposited to a thickness in the range of 75-150 Angstroms and the width (i.e. gate length) of gate electrode placeholder 208 is in the range of 10-20 nanometers.

Figure 2D:
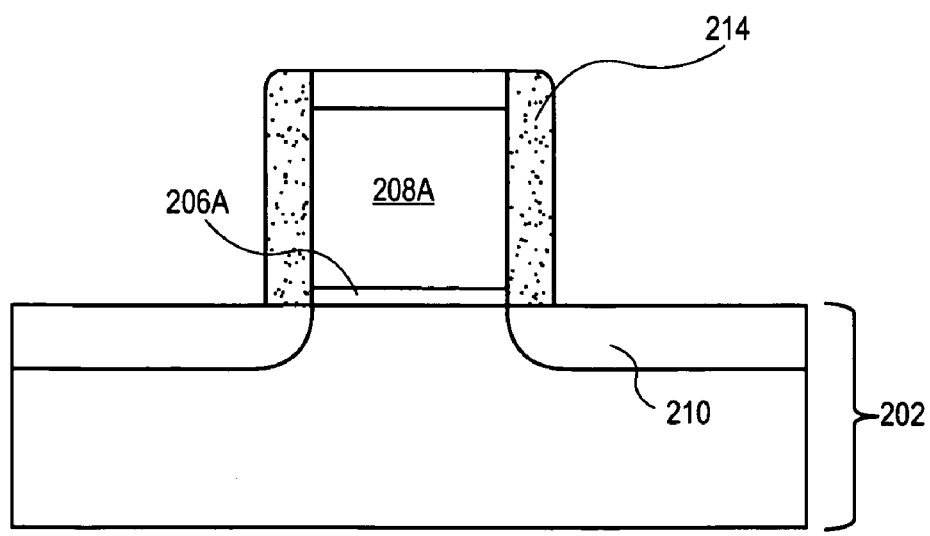
Figure 2E:
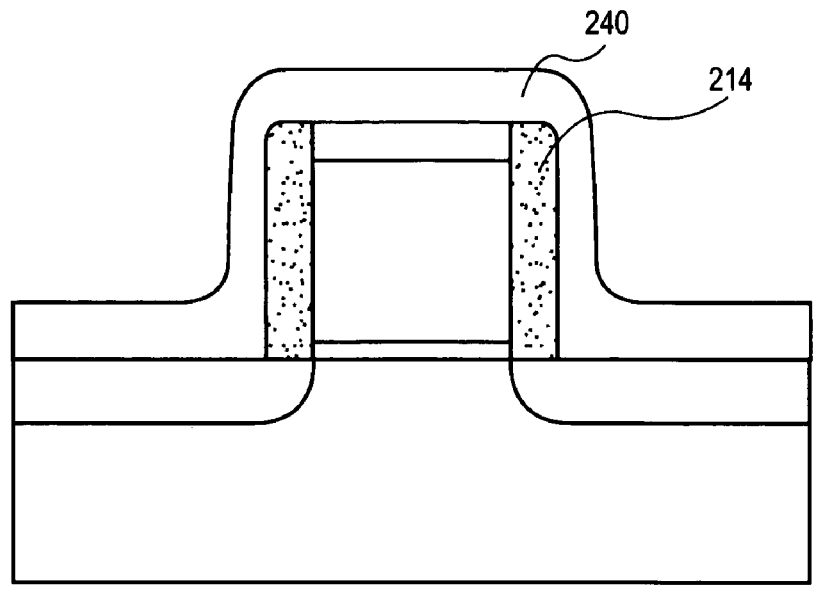

Referring to FIG. 2D, inner gate isolation spacers 214 may be formed from material layer 230 by an anisotropic etch process. In one embodiment, material layer 230 is dry etched by a remote plasma etch or a reactive ion etch process. In another embodiment, material layer 230 is patterned to form inner gate isolation spacers 214 by using a vertical dry or plasma etch process comprising fluorocarbons of the general formula $C_xF_y$, where x and y are natural numbers. In another embodiment, material layer 230 is patterned to form inner gate isolation spacers 214 by using a vertical dry or plasma etch process comprising free radical fluorocarbons. Inner gate isolation spacers 214 may sit above the top surface of substrate or epitaxial layer 202 and may have a width at the top surface of substrate or epitaxial layer 202 substantially equal to the original thickness of material layer 230. In accordance with an embodiment of the present invention, inner gate isolation spacers 214 reside above ultra-shallow tip extensions 210. In one embodiment, inner gate isolation spacers 214 form a hermetic seal with gate electrode placeholder 208A and the top surface of substrate or epitaxial layer 202 to encapsulate gate dielectric layer 206A, as depicted in FIG. 2D. In one embodiment, a wet chemical cleaning process step comprising the application of an aqueous solution of hydrofluoric acid, ammonium fluoride or both follows the formation of inner gate isolation spacers 214.

A pair of outer gate isolation spacers may then be formed by any suitable technique. In one embodiment, referring to FIG. 2E, a material layer 240 is deposited by a chemical vapor deposition process and is conformal with the structure formed in FIG. 2D. In an embodiment, material layer 240 is comprised of an insulating layer. In a particular embodiment, material layer 240 is comprised of silicon dioxide, silicon oxy-nitride or carbon-doped silicon oxide. In another embodiment, material layer 240 is comprised of silicon nitride or carbon-doped silicon nitride. In accordance with an embodiment of the present invention, material layer 240 has different etch characteristics as compared to the etch characteristics of material layer 230 used to from inner gate isolation spacers 214. Thus, inner gate isolation spacers 214 may be etched selectively without impacting material layer 240 or structures formed therefrom. In one embodiment, material layer 240 is comprised of silicon dioxide, silicon oxy-nitride or carbon-doped silicon oxide and inner gate isolation spacers 214 are comprised of silicon nitride or carbon-doped silicon nitride. In another embodiment, material layer 240 is comprised of silicon nitride or carbon-doped silicon nitride and inner gate isolation spacers 214 are comprised of silicon dioxide, silicon oxy-nitride or carbon-doped silicon oxide.

Material layer 240 may be deposited to a thickness selected to determine the final width of the outer gate isolation spacers. In accordance with an embodiment of the present invention, material layer 240 is deposited to a thickness of that determines the location of self-aligned source/drain regions. In one embodiment, material layer 240 is deposited to a thickness in the range of 5-300 Angstroms.

Figure 2F:
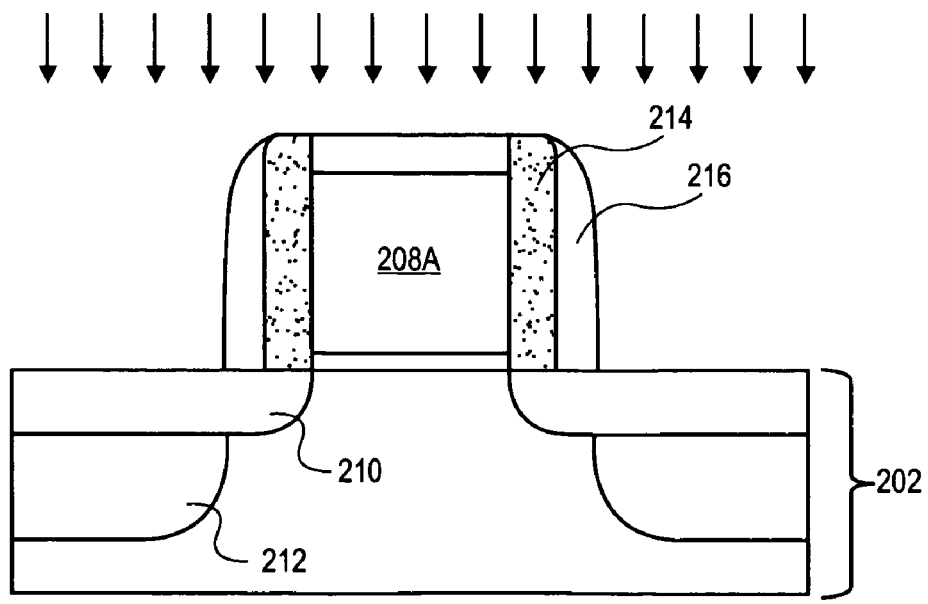

Referring to FIG. 2F, outer gate isolation spacers 216 may be formed from material layer 240 by an anisotropic etch process. In one embodiment, material layer 240 is dry etched by a remote plasma etch or an active ion etch process. In another embodiment, material layer 240 is patterned to form outer gate isolation spacers 216 by using a vertical dry or plasma etch process comprising fluorocarbons of the general formula $C_xF_y$, where x and y are natural numbers. In another embodiment, material layer 240 is patterned to form outer gate isolation spacers 216 by using a vertical dry or plasma etch process comprising free radical fluorocarbons. Outer gate isolation spacers 216 may sit above the top surface of substrate or epitaxial layer 202 and may have a width at the top surface of substrate or epitaxial layer 202 substantially equal to the original thickness of material layer 240. In accordance with an embodiment of the present invention, outer gate isolation spacers 216 reside above ultra-shallow tip extensions 210. In one embodiment, outer gate isolation spacers 216 form a hermetic seal with inner gate isolation spacers 214 and the top surface of substrate or epitaxial layer 202, as depicted in FIG. 2F. In one embodiment, a wet chemical cleaning process step comprising the application of an aqueous solution of hydrofluoric acid, ammonium fluoride or both follows the formation of outer gate isolation spacers 216.

Referring to FIG. 2F, source/drain regions 212 may subsequently be formed by implanting charge carrier dopant impurity atoms into substrate or epitaxial layer 202. Outer gate isolation spacers 216, inner gate isolation spacers 214 and gate electrode placeholder 208A may act to mask a portion of substrate or epitaxial layer 202, forming self-aligned source/drain regions 212. In effect, the width of outer gate isolation spacers 216 may play a role in determining the dimensions and location of source/drain regions 212. In one embodiment, boron, arsenic, phosphorus, indium or a combination thereof is implanted into substrate or epitaxial layer 202 to form source/drain regions 212. Subsequent to the formation of source/drain regions 212, raised source/drain regions which strain the channel region may be formed and/or a silicide process may be carried out; these process steps are known in the art.

Figure 2G:
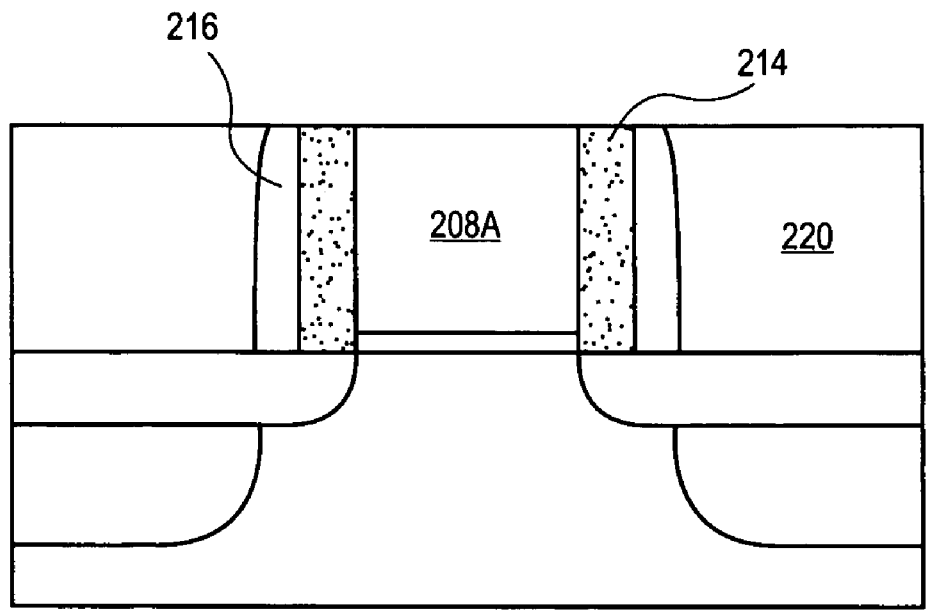

Subsequent to the formation of outer gate isolation spacers 216 and source/drain regions 212, process steps compatible with a replacement gate process scheme may be carried out. In accordance with an embodiment of the present invention, an interlayer dielectric layer is formed over the structure of FIG. 2F and the interlayer dielectric layer is polished back with a chemical-mechanical polish step to reveal gate electrode placeholder 208A. In one embodiment, protective capping layer 218 acts as a polish-stop layer and a wet etch process is used to remove protective capping layer 218 in order to reveal the top surface of gate electrode placeholder 208A. Referring to FIG. 2G, the interlayer dielectric layer may be polished such that the top surface of the resulting interlayer dielectric blocks 220 is flush with the top surface of gate electrode placeholder 208A, revealing inner gate isolation spacers 214 and outer gate isolation spacers 216.

Figure 2H:
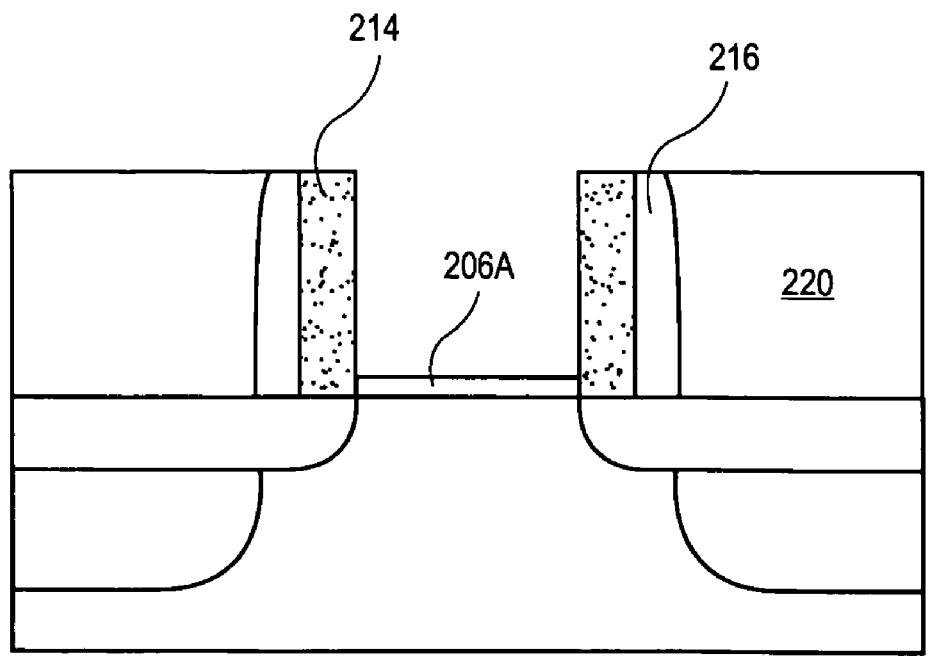

Referring to FIG. 2H, gate electrode placeholder 208A may be removed by any suitable technique that does not significantly impact interlayer dielectric blocks 220, outer gate isolation spacers 216, inner gate isolation spacers 214 or gate dielectric layer 206A. In accordance with an embodiment of the present invention, gate electrode placeholder 208A is removed by a dry etch or wet etch process. In one embodiment, gate electrode placeholder 208A is comprised of polycrystalline silicon or amorphous silicon and is removed with a dry etch process comprising $SF_6$. In another embodiment, gate electrode placeholder 208A is comprised of polycrystalline silicon or amorphous silicon and is removed with a wet etch process comprising aqueous $NH_4OH$ or tetramethylammonium hydroxide. In an embodiment, gate electrode placeholder 208A is comprised of silicon dioxide and is removed with a wet etch comprising aqueous hydrofluoric acid, ammonium fluoride or both. In one embodiment, gate electrode placeholder 208A is comprised of silicon nitride and is removed with a wet etch comprising aqueous phosphoric acid.

Figure 2I:
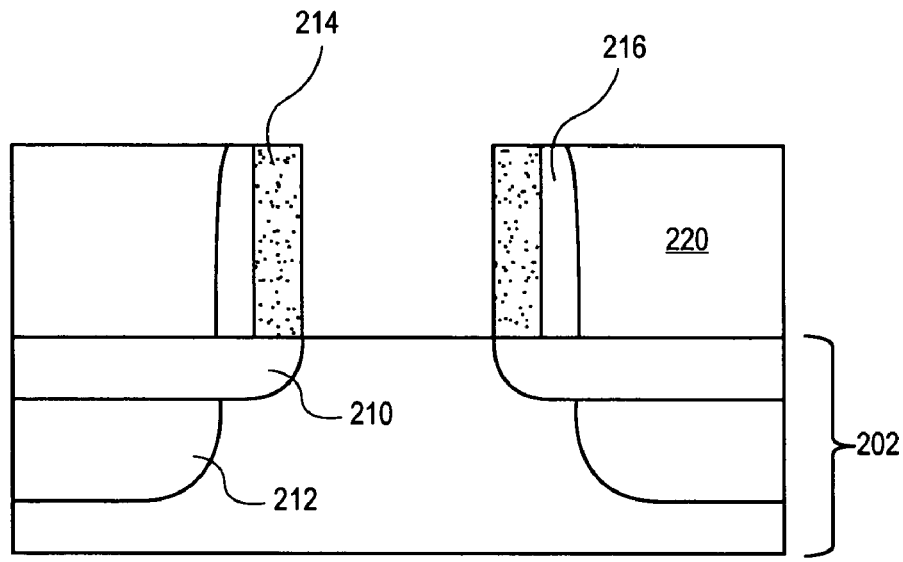

Referring to FIG. 2I, gate dielectric layer 206A may be removed by any suitable technique that does not significantly impact interlayer dielectric blocks 220, outer gate isolation spacers 216 or substrate or epitaxial layer 202, including ultra-shallow tip extensions 210 and source/drain regions 212. In accordance with an embodiment of the present invention, gate dielectric layer 206A is removed by a dry etch or wet etch process. In one embodiment, gate dielectric layer 206A is comprised of silicon dioxide or silicon oxy-nitride and is removed with a wet etch comprising aqueous hydrofluoric acid, ammonium fluoride or both. In another embodiment, gate dielectric layer 206A is comprised of a high-k dielectric layer and is removed with a wet etch comprising aqueous phosphoric acid. In one embodiment, inner gate isolation spacers 214 are removed in the same step as the removal of gate dielectric layer 206A. In another embodiment, the final gate dielectric layer comprises gate dielectric 206A, i.e. 206A is not removed. In one embodiment, gate dielectric layer 206A is removed in the same step as the removal of gate electrode placeholder 208A.

Figure 2J:
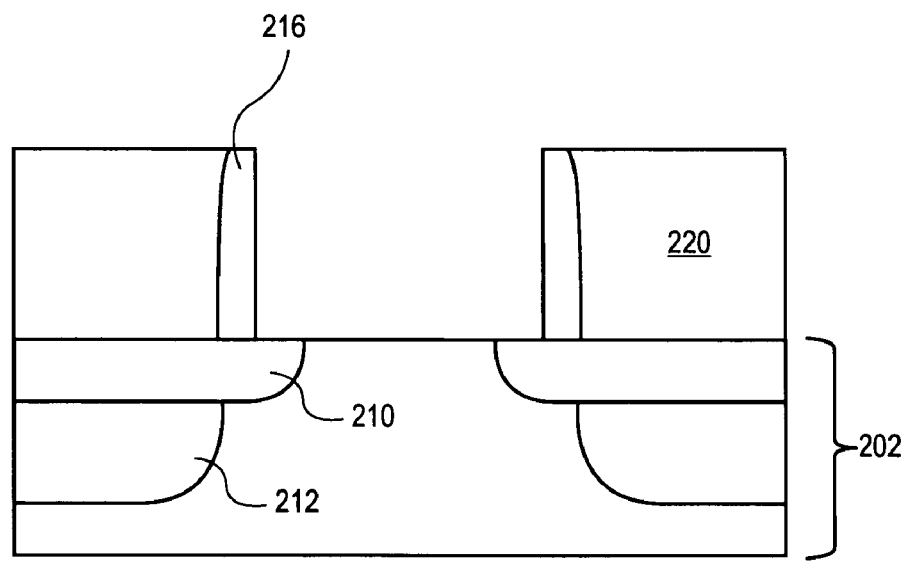

Referring to FIG. 2J, inner gate isolation spacers 214 may be removed by any suitable technique that does not significantly impact interlayer dielectric blocks 220, outer gate isolation spacers 216 or substrate or epitaxial layer 202, including ultra-shallow tip extensions 210 and source/drain regions 212. In accordance with an embodiment of the present invention, inner gate isolation spacers 214 are removed by a dry etch or wet etch process. In one embodiment, inner gate isolation spacers 214 are comprised of silicon dioxide, silicon oxy-nitride or carbon-doped silicon oxide and are removed with a wet etch comprising aqueous hydrofluoric acid, ammonium fluoride or both. In another embodiment, inner gate isolation spacers 214 are comprised of silicon nitride or carbon-doped silicon nitride and are removed with a wet etch comprising aqueous phosphoric acid. In one embodiment, inner gate isolation spacers 214 are removed in the same step as the removal of gate electrode placeholder 208A. In another embodiment, inner gate isolation spacers 214 are removed in the same step as the removal of gate dielectric layer 206A. In one embodiment, inner gate isolation spacers 214 are removed in the same step as the removal of gate electrode placeholder 208A and gate dielectric layer 206A.

Figure 2K:
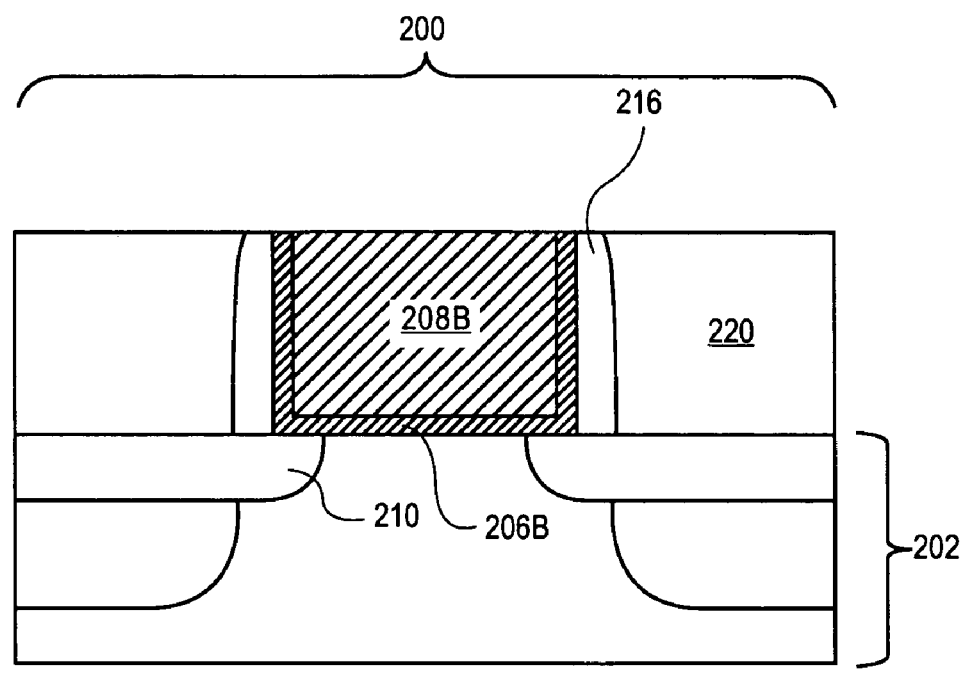

The structure from FIG. 2J may provide a framework for a replacement gate process. Referring to FIG. 2K, a replacement gate dielectric layer 206B may be formed above substrate or epitaxial layer 202. In accordance with an embodiment of the present invention, replacement gate dielectric layer 206B is formed with any material suitable to insulate gate electrode 208B from substrate or epitaxial layer 202. In one embodiment, replacement gate dielectric layer 206B is formed by a thermal oxidation process and is comprised of silicon dioxide or silicon oxy-nitride. In another embodiment, replacement gate dielectric layer 206B is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide. In one embodiment, replacement gate dielectric layer 206B is deposited conformally with the top surface of substrate or epitaxial layer 202 and with the sidewalls of outer gate isolation spacers 216, as depicted in FIG. 2K.

Gate electrode 208B may be formed with any material with conductive properties and suitable for filling the region between outer gate isolation spacers 216. In one embodiment, gate electrode 208B is comprised of doped polycrystalline silicon or a silicide thereof. In another embodiment, gate electrode 208B is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, a chemical-mechanical process step is used subsequent to forming gate electrode 208B in order to remove unwanted material from the surface of interlayer dielectric blocks 220, as depicted in FIG. 2K. In accordance with an embodiment of the present invention, gate electrode 208B overlaps the portion of substrate or epitaxial layer 202 that comprises ultra-shallow tip extensions 210, as depicted in FIG. 2K.

Thus, referring to FIG. 2K, a planar MOS-FET 200 comprising a gate electrode that overlaps ultra-shallow junctions may be formed by way of an expansion replacement gate process utilizing sacrificial gate isolation spacers. Planar MOS-FET 200 may be an N-type or a P-type semiconductor device. As will be appreciated in the typical integrated circuit, both N- and P-channel transistors may be fabricated in a single substrate or epitaxial layer to form a CMOS integrated circuit.

Figure 3A:
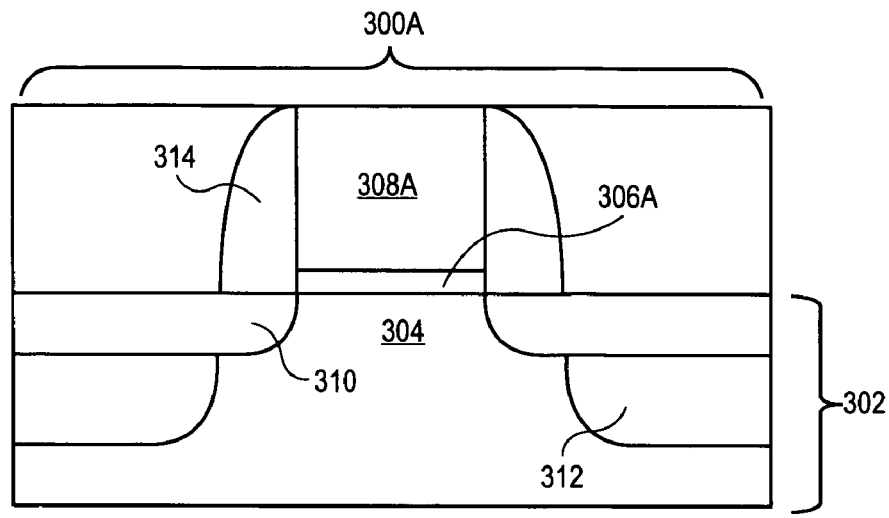
FIGS. 3A-D illustrate cross-sectional views representing the formation of a planar MOS-FET with ultra-shallow junctions, in accordance with an embodiment of the present invention.

The present invention is not limited to a two-spacer process. For example, a single spacer process may be used to form semiconductor device comprising a gate electrode that overlaps ultra-shallow junctions. FIGS. 3A-D illustrate cross-sectional views representing the formation of a planar MOS-FET with ultra-shallow junctions, in accordance with an embodiment of the present invention. Referring to FIG. 3A, MOS-FET 300A may be comprised of substrate or epitaxial layer 302 which includes a channel region 304, a gate dielectric layer 306A, a gate electrode placeholder 308A, ultra-shallow tip extensions 310, source/drain regions 312 and a single set of gate isolation spacers 314. In accordance with an embodiment of the present invention, gate electrode placeholder 308A overlaps negligibly over ultra-shallow tip extensions 310, as depicted in FIG. 3A.

Figure 3B:
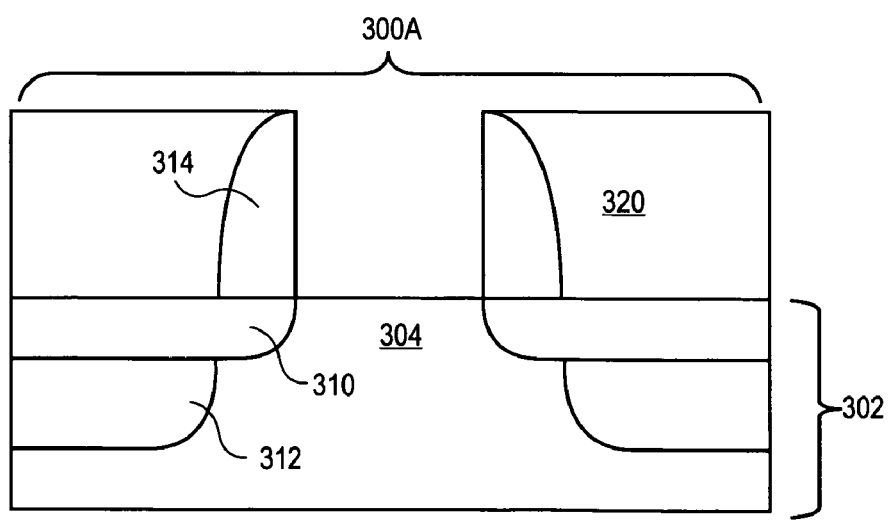

Referring to FIG. 3B, gate electrode placeholder 308A may be removed by any suitable technique that does not significantly impact interlayer dielectric blocks 320, gate isolation spacers 314 or gate dielectric layer 306A. In accordance with an embodiment of the present invention, gate electrode placeholder 308A is removed by a dry etch or wet etch process. In one embodiment, gate electrode placeholder 308A is comprised of polycrystalline silicon or amorphous silicon and is removed with a dry etch process comprising SF$_6$. In another embodiment, gate electrode placeholder 308A is comprised of polycrystalline silicon or amorphous silicon and is removed with a wet etch process comprising aqueous NH$_4$OH or tetramethylammonium hydroxide. In an embodiment, gate electrode placeholder 308A is comprised of silicon dioxide and is removed with a wet etch comprising aqueous hydrofluoric acid, ammonium fluoride or both. In one embodiment, gate electrode placeholder 308A is comprised of silicon nitride and is removed with a wet etch comprising aqueous phosphoric acid. In another embodiment, gate electrode placeholder 308A comprises a metal layer that is removed with a Piranha (H$_2$SO$_4$/H$_2$O$_2$/H$_2$O) wet etch.

Referring to FIG. 3B, gate dielectric layer 306A may be removed by any suitable technique that does not significantly impact interlayer dielectric blocks 320, gate isolation spacers 314 or substrate or epitaxial layer 302, including ultra-shallow tip extensions 310 and source/drain regions 312. In accordance with an embodiment of the present invention, gate dielectric layer 306A is removed by a dry etch or wet etch process. In one embodiment, gate dielectric layer 306A is comprised of silicon dioxide or silicon oxy-nitride and is removed with a wet etch comprising aqueous hydrofluoric acid, ammonium fluoride or both. In another embodiment, gate dielectric layer 306A is comprised of a high-k dielectric layer and is removed with a wet etch comprising aqueous phosphoric acid. In one embodiment, gate isolation spacers 316 are thinned in the same step as the removal of gate dielectric layer 306A.

Figure 3C:
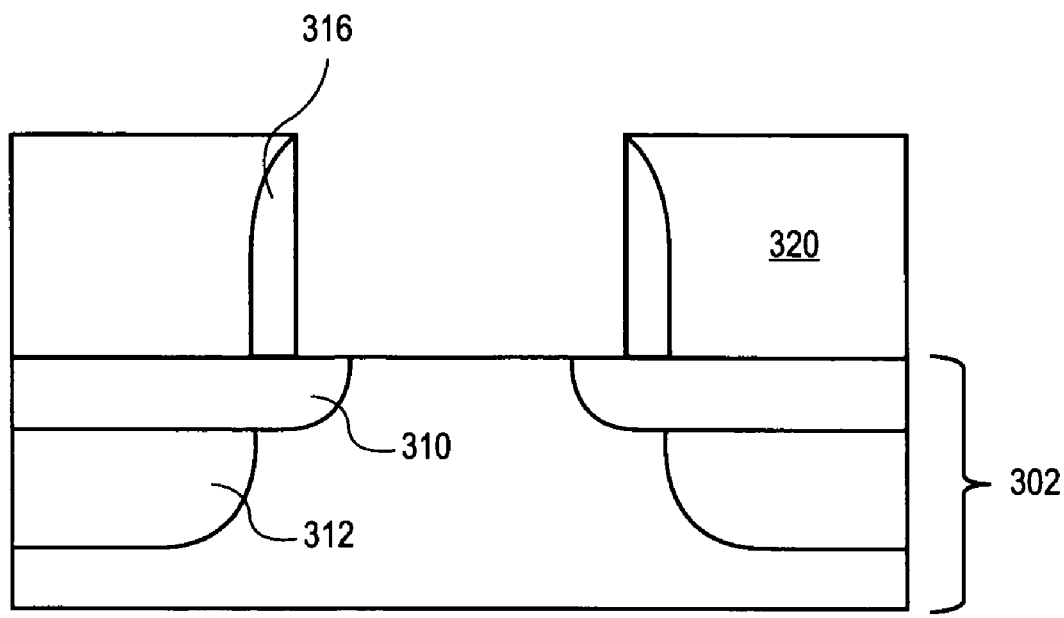

Referring to FIG. 3C, gate isolation spacers 314 may be thinned to form thinned gate isolation spacers 316 by any suitable technique that does not significantly impact interlayer dielectric blocks 320 or substrate or epitaxial layer 302, including ultra-shallow tip extensions 310 and source/drain regions 312. In accordance with an embodiment of the present invention, gate isolation spacers 314 are thinned by a dry etch or wet etch process. In one embodiment, gate isolation spacers 314 are comprised of silicon dioxide, silicon oxy-nitride or carbon-doped silicon oxide and are thinned with a wet etch comprising aqueous hydrofluoric acid, ammonium fluoride or both. In another embodiment, gate isolation spacers 314 are comprised of silicon nitride or carbon-doped silicon nitride and are thinned with a wet etch comprising aqueous phosphoric acid. In accordance with an embodiment of the present invention, gate isolation spacers 314 are thinned to an extent determined by the desired amount of overlap of a replacement gate electrode over ultra-shallow tip extensions. In one embodiment, gate isolation spacers 314 are thinned by an amount in the range of 50-200 Angstroms and the width (i.e. gate length) of gate electrode placeholder 308 is in the range of 10-20 nanometers.

Figure 3D:
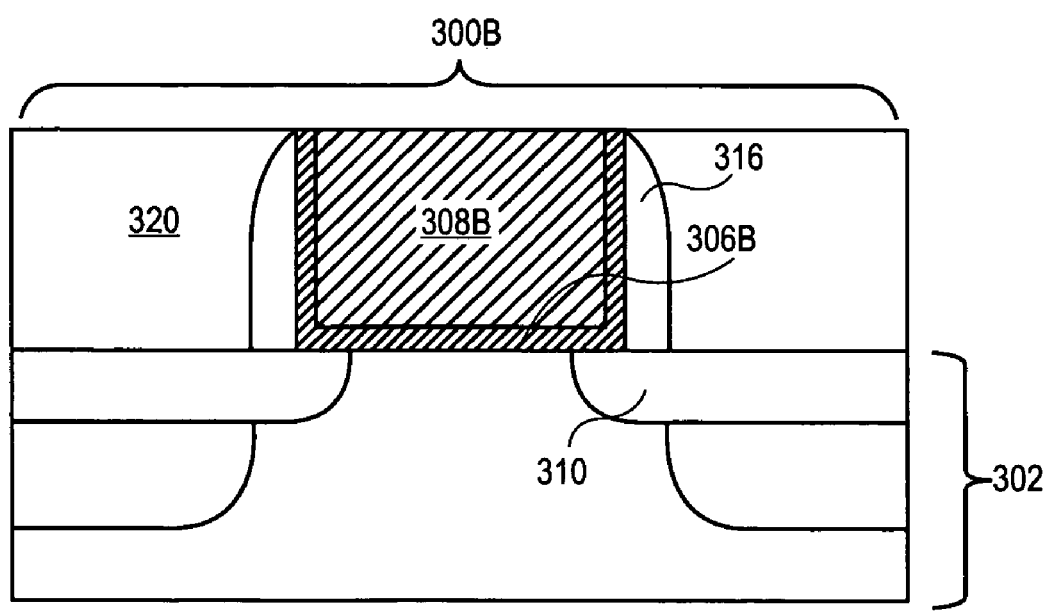

The structure from FIG. 3C may provide a framework for a replacement gate process. Referring to FIG. 3D, a replacement gate dielectric layer 306B may be formed above substrate or epitaxial layer 302. In accordance with an embodiment of the present invention, replacement gate dielectric layer 306B is formed with any material suitable to insulate gate electrode 308B from substrate or epitaxial layer 302. In one embodiment, replacement gate dielectric layer 306B is formed by a thermal oxidation process and is comprised of silicon dioxide or silicon oxy-nitride. In another embodiment, replacement gate dielectric layer 306B is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide. In one embodiment, replacement gate dielectric layer 306B is deposited conformally with the top surface of substrate or epitaxial layer 302 and with the sidewalls of thinned gate isolation spacers 316, as depicted in FIG. 3D.

Gate electrode 308B may be formed with any material with conductive properties and suitable for filling the region between thinned gate isolation spacers 316. In one embodiment, gate electrode 308B is comprised of doped polycrystalline silicon or a silicide thereof. In another embodiment, gate electrode 308B is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, a chemical-mechanical process step is used subsequent to forming gate electrode 308B in order to remove unwanted material from the surface of interlayer dielectric blocks 320, as depicted in FIG. 3D. In accordance with an embodiment of the present invention, gate electrode 308B overlaps the portion of substrate or epitaxial layer 302 that comprises ultra-shallow tip extensions 310, as depicted in FIG. 3D.

Thus, referring to FIG. 3D, a planar MOS-FET 300B comprising a gate electrode that overlaps ultra-shallow junctions may be formed by way of a replacement gate process. Planar MOS-FET 300B may subsequently be incorporated into an integrated circuit by conventional process steps, as known in the art.

The present invention is not limited to the formation of a planar MOS-FETs comprising a gate electrode that overlaps ultra-shallow junctions. For example, devices with a three-dimensional architecture, such a independently accessed double gate devices, FIN-FETs, tri-gate devices and gate-all-around devices, may benefit from the above process. As an exemplary embodiment in accordance with the present invention, FIGS. 4A-B illustrate cross-sectional views representing the formation of an independently-accessed double gated MOS-FET with ultra-shallow junctions.

Figure 4A:
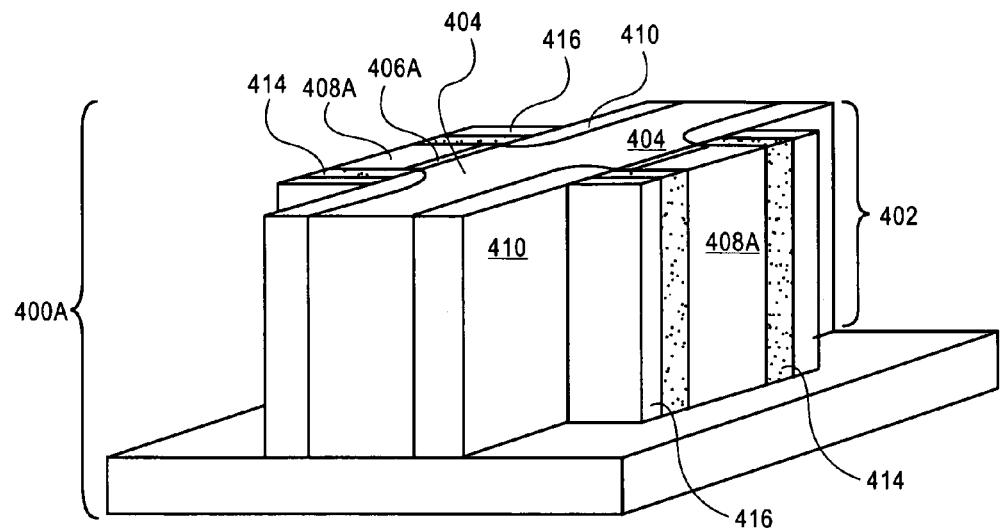
FIGS. 4A-B illustrate cross-sectional views representing the formation of an independently-accessed double gated MOS-FET with ultra-shallow junctions, in accordance with an embodiment of the present invention.

Referring to FIG. 4A, independently accessed double gate MOS-FET 400A may be comprised of substrate or epitaxial layer 402 which includes channel regions 404, gate dielectric layers 406A, gate electrode placeholders 408A, ultra-shallow tip extensions 410, inner sets of gate isolation spacers 414 and outer sets of gate isolation spacers 416. In accordance with an embodiment of the present invention, gate electrode placeholders 408A overlap negligibly over ultra-shallow tip extensions 410, as depicted in FIG. 4A.

Figure 4B:
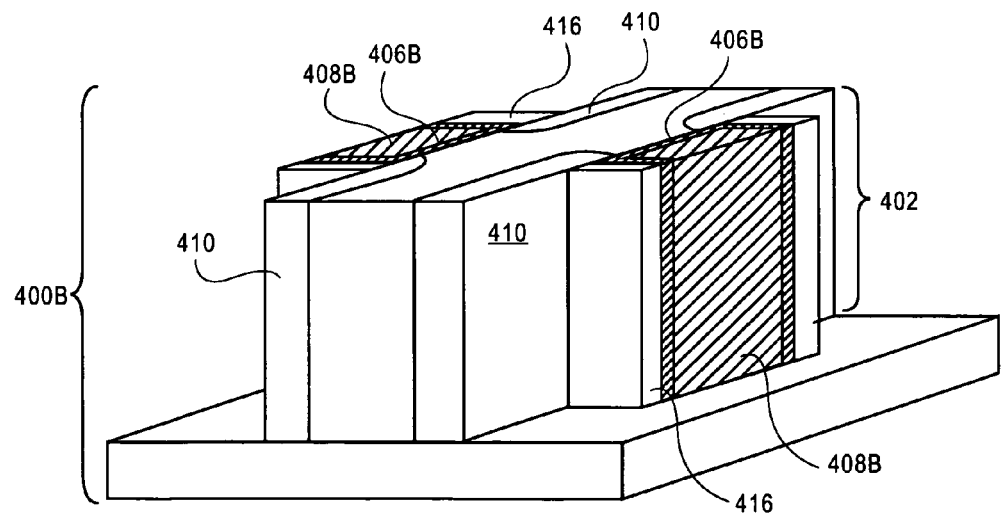

Referring to FIG. 4B, the inner sets of gate isolation spacers 414 may be removed. Additionally, gate dielectric layers 406A and gate electrode placeholders 408A may be replaced with gate dielectric layers 406B and gate electrodes 408B, respectively. In accordance with an embodiment of the present invention, gate electrodes 408B overlap the regions of substrate or epitaxial layer 402 that comprise ultra-shallow tip extensions 410. Thus, the dimensions of gate electrode placeholders 408A with a smaller than desirable gate length, coupled with removable inner sets of gate isolation spacers 414, may be targeted for the fabrication of gate electrode 408B with an expanded, and desired, gate length.

Thus, referring to FIG. 4B, an independently accessed double gate MOS-FET 400B comprising gate electrodes that overlap ultra-shallow junctions may be formed by way of an expansion replacement gate process utilizing sacrificial gate isolation spacers. Independently accessed double gate MOS-FET 400B may subsequently be incorporated into an integrated circuit by conventional process steps, as known in the art. As will be appreciated by one of ordinary skill in the art, other three-dimensional semiconductor devices may be formed in a similar manner. For example, in accordance with an embodiment of the present invention, a tri-gate device with a top gate above substrate 402 is formed by way of an expansion replacement gate process utilizing sacrificial gate isolation spacers. Other devices such as double-gated devices and FIN-FETs may also be formed.

Figure 5A:
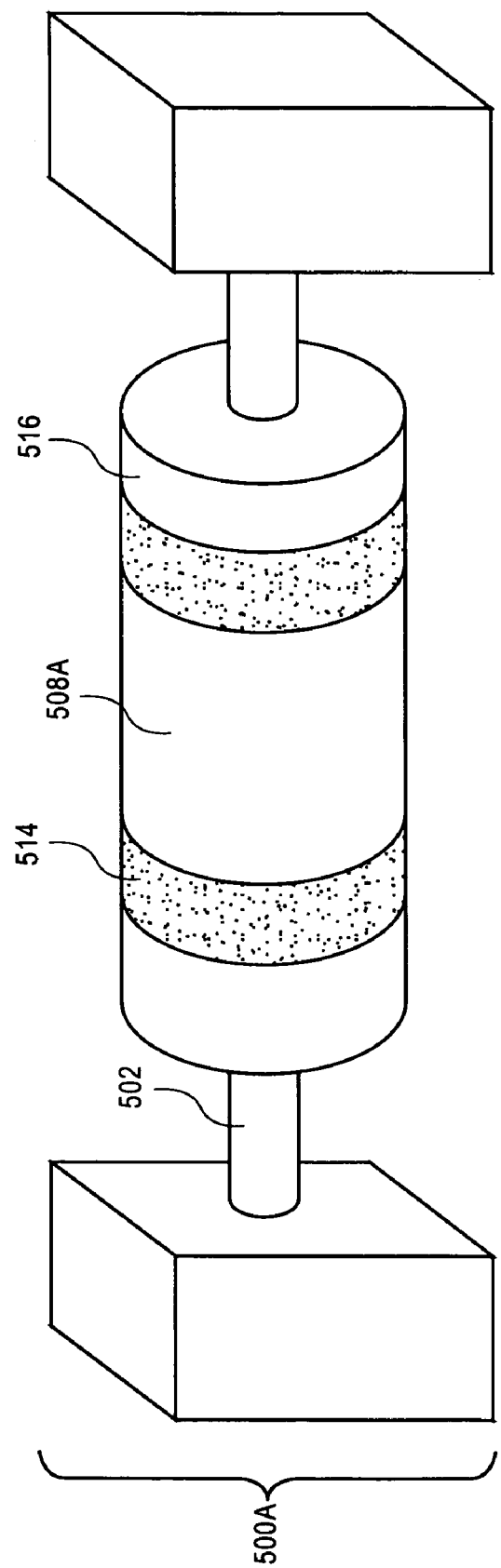
FIGS. 5A-B illustrate cross-sectional views representing the formation of a gate-all-around MOS-FET with ultra-shallow junctions, in accordance with an embodiment of the present invention.
Figure 5B:
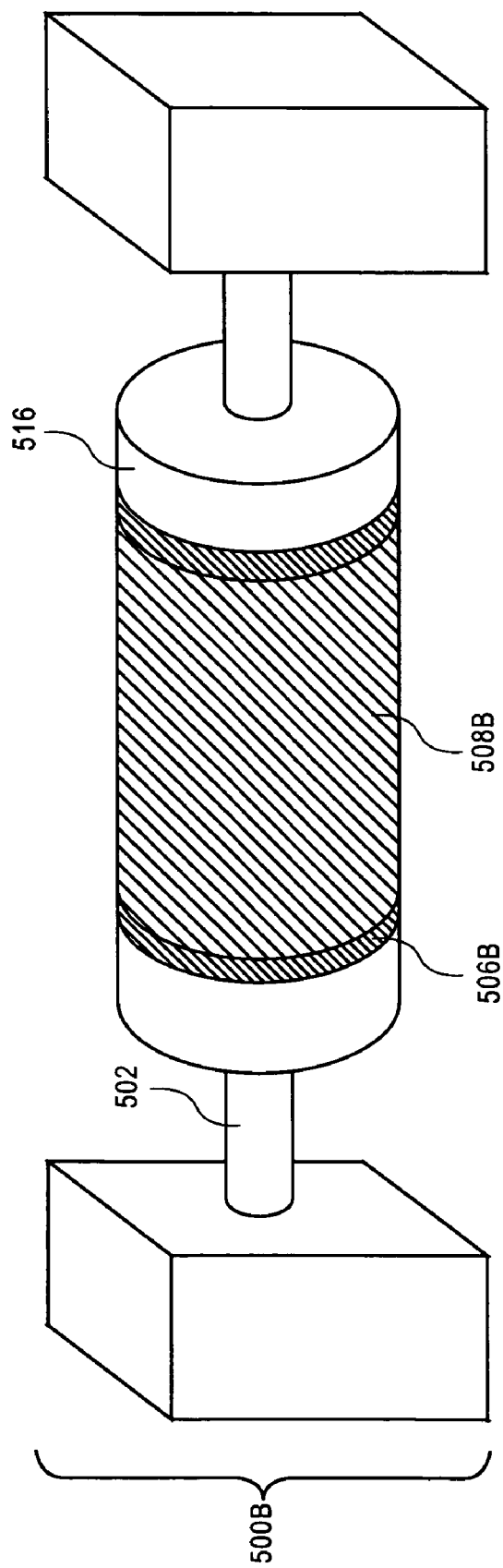

As another exemplary embodiment in accordance with the present invention, FIGS. 5A-B illustrate cross-sectional views representing the formation of a gate-all-around MOS-FET with ultra-shallow junctions. Referring to FIG. 5A, gate-all-around MOS-FET 500A may be comprised of a nanowire 502, e.g. a silicon, germanium, silicon/germanium or III-V composite nanowire, a gate electrode placeholder 508A, ultra-shallow tip extensions (not shown), an inner set of gate isolation spacers 514 and an outer set of gate isolation spacers 516. In accordance with an embodiment of the present invention, gate electrode placeholder 408A overlaps negligibly over the ultra-shallow tip extensions.

Referring to FIG. 5B, the inner set of gate isolation spacers 514 may be removed. Additionally, a gate dielectric layer (not shown) and gate electrode placeholder 508A may be replaced with gate dielectric layer 506B and gate electrode 508B, respectively. In accordance with an embodiment of the present invention, gate electrode 508B overlaps the regions of nanowire 502 that comprise ultra-shallow tip extensions (not shown). Thus, the dimensions of gate electrode placeholder 508A with a smaller than desirable gate length, coupled with a removable inner set of gate isolation spacers 514, may be targeted for the fabrication of gate electrode 508B with an expanded, and desired, gate length.

Thus, referring to FIG. 5B, a gate-all-around MOS-FET 500B comprising a gate electrode that overlaps ultra-shallow junctions may be formed by way of a replacement gate process. Gate-all-around MOS-FET 500B may subsequently be incorporated into an integrated circuit by conventional process steps, as known in the art.

Therefore, a replacement gate process may be utilized to enable the overlap of a gate electrode over the regions of a semiconductor substrate where ultra-shallow junctions reside. In one embodiment, a sacrificial spacer may be utilized in conjunction with the replacement gate process. In another embodiment an initial gate electrode is formed with a gate length smaller than the desired final gate length and is subsequently replaced with an expanded gate electrode having the desired gate length.

What is claimed is:

1. A method of forming a semiconductor structure comprising:
    forming a first gate electrode above a substrate;
    forming tip implant regions in said substrate, on either side of said first gate electrode;
    annealing said tip implant regions with a laser anneal process;
    forming a first pair of gate isolation spacers adjacent the sidewalls of said first gate electrode;
    forming a second pair of gate isolation spacers adjacent the sidewalls of said first pair of gate isolation spacers;
    removing said first gate electrode and said first pair of gate isolation spacers; and
    forming a second gate electrode in between said second pair of gate isolation spacers, wherein the annealing said tip implant regions is performed prior to forming said second gate electrode.

2. The method of claim 1 wherein said first and said second pair of gate isolation spacers are comprised of different materials.

3. The method of claim 2 wherein said first pair of gate isolation spacers is comprised of silicon dioxide, silicon oxy-nitride or carbon-doped silicon oxide and said second pair of gate isolation spacers is comprised of silicon nitride or carbon-doped silicon nitride.

4. The method of claim 2 wherein said first pair of gate isolation spacers is comprised of silicon nitride or carbon-doped silicon nitride and said second pair of gate isolation spacers is comprised of silicon dioxide, silicon oxy-nitride or carbon-doped silicon oxide.

5. The method of claim 1 wherein said first gate electrode is comprised of polysilicon and said second gate electrode is comprised of a metal layer.

6. A method of forming a semiconductor structure comprising:
    forming a first gate dielectric layer above a substrate;
    forming a first gate electrode above said first gate dielectric layer;
    forming tip implant regions in said substrate, on either side of said first gate electrode;
    annealing said tip implant regions with a laser anneal process;
    forming a first pair of gate isolation spacers adjacent the sidewalls of said first gate electrode and above said tip implant regions, wherein said first pair of gate isolation spacers are separated by a first width;
    forming a second pair of gate isolation spacers adjacent the sidewalls of said first pair of gate isolation spacers, wherein said second pair of gate isolation spacers are separated by a second width, and wherein said second width is greater than said first width;
    forming source/drain regions in said substrate, wherein said source/drain regions are on either side of said first gate electrode;
    removing said first gate electrode, said first gate dielectric layer and said first pair of gate isolation spacers; and
    forming a second gate dielectric layer and a second gate electrode in between said second pair of gate isolation spacers, wherein said second gate electrode is above said tip implant regions, and wherein the annealing said tip implant regions is performed prior to forming said second gate dielectric layer and said second gate electrode.

7. The method of claim 6 wherein said first and said second pair of gate isolation spacers are comprised of different materials.

8. The method of claim 7 wherein said first pair of gate isolation spacers is comprised of silicon dioxide, silicon oxy-nitride or carbon-doped silicon oxide and said second pair of gate isolation spacers is comprised of silicon nitride or carbon-doped silicon nitride.

9. The method of claim 8 wherein removing said first pair of gate isolation spacers comprises wet etching with an aqueous solution of hydrofluoric acid, ammonium fluoride, or both.

10. The method of claim 7 wherein said first pair of gate isolation spacers is comprised of silicon nitride or carbon-doped silicon nitride and said second pair of gate isolation spacers is comprised of silicon dioxide, silicon oxy-nitride or carbon-doped silicon oxide.

11. The method of claim 10 wherein removing said first pair of gate isolation spacers comprises wet etching with an aqueous solution of phosphoric acid.

12. The method of claim 6 wherein said first gate electrode is comprised of polysilicon and said second gate electrode is comprised of a metal layer.

13. The method of claim 6 wherein said first gate dielectric layer is comprised of silicon dioxide or silicon oxy-nitride and said second gate dielectric layer is comprised of a high-k dielectric layer.

14. The method of claim 6 wherein forming said tip implant regions in said substrate comprises implanting phosphorus dopant atoms with an energy in the range of 2 keV-10 keV at a dose in the range of 5E14 atoms/cm$^2$-5E15 atoms/cm$^2$ to form a post-annealing phosphorus dopant concentration in the range of 1E20 atoms/cm$^3$-1E21 atoms/cm$^3$, or implanting arsenic dopant atoms with an energy in the range of 1 keV-5 keV at a dose in the range of 5E14 atoms/cm$^2$-5E15 atoms/cm$^2$ to form a post-annealing arsenic dopant concentration in the range of 1E20 atoms/cm$^3$-1E21 atoms/cm$^3$, or implanting boron dopant atoms with an energy in the range of 0.2 keV-1 keV at a dose in the range of 5E14 atoms/cm$^2$-5E15 atoms/cm$^2$ to form a post-annealing boron dopant concentration in the range of 1E20 atoms/cm$^3$-1E21 atoms/cm$^3$.

15. The method of claim 6 wherein subsequent to annealing said tip implant regions with a laser anneal process, the depth of said tip implant regions in said substrate is in the range of 5 nanometers-30 nanometers.

* * * * *